(12) United States Patent
Bartko et al.

(10) Patent No.: US 12,248,009 B2
(45) Date of Patent: Mar. 11, 2025

(54) METHOD FOR DETERMINING TEST SIGNALS FOR ELECTROMAGNETIC SUSCEPTIBILITY TESTING OF A DEVICE-UNDER-TEST

(71) Applicant: Rohde & Schwarz GmbH & Co. KG, Munich (DE)

(72) Inventors: Hendrik Bartko, Unterhaching (DE); Siewleng Ng, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 18/602,281

(22) Filed: Mar. 12, 2024

(65) Prior Publication Data

US 2024/0361372 A1    Oct. 31, 2024

(30) Foreign Application Priority Data

Apr. 28, 2023   (EP) .................................... 23170531

(51) Int. Cl.
    *G01R 29/08*    (2006.01)
    *G06N 20/00*    (2019.01)

(52) U.S. Cl.
    CPC ......... *G01R 29/0807* (2013.01); *G06N 20/00* (2019.01)

(58) Field of Classification Search
    CPC ............ G01R 29/0807; G01R 29/0814; G01R 29/0864; G06N 20/00
    See application file for complete search history.

(56) References Cited

U.S. PATENT DOCUMENTS

| 9,322,847 B2 | 4/2016 | Hamilton |
| 10,749,618 B1 * | 8/2020 | Vahey .................... G06N 20/00 |
| 2020/0158823 A1 | 5/2020 | Mikhailov |

FOREIGN PATENT DOCUMENTS

| DE | 10 2020 208 306 A1 | 1/2022 |
| DE | 10 2020 208 306 B4 | 5/2022 |
| EP | 3 764 112 A1 | 1/2021 |

OTHER PUBLICATIONS

Galen Koepke et al; "Complexities of Testing Interference and Coexistence of Wireless Systems in Critical Infrastructure"; NIST Technical Note 1885; NIST, National Institute of Standards and Technology; U.S. Department of Commerce; Jul. 2, 2015; pp. 1-61.

(Continued)

*Primary Examiner* — Manuel L Barbee
(74) *Attorney, Agent, or Firm* — Studebaker Brackett PLLC

(57) ABSTRACT

The invention relates to a method and a system for determining test signals for electromagnetic susceptibility, EMS, testing of a device-under-test, DUT. The method comprises the steps of: receiving at least one DUT parameter which defines a property of the DUT; receiving at least one environmental parameter which defines an electromagnetic environment, EME, in which the DUT is to be used; receiving information on an EM emission behavior, in particular an emission spectrum, of the DUT; and inputting the at least one DUT parameter, the at least one environmental parameter and the information on the EM emission behavior to a machine learning, ML, or artificial intelligence, AI, model. The ML or AI model is configured to determine one or more test signals for EMS testing of the DUT based on the at least one DUT parameter, the at least one environmental parameter and the information on the EM emission behavior.

9 Claims, 4 Drawing Sheets

(56) References Cited

OTHER PUBLICATIONS

Extended European Search Report issued in EP 23170531.0-1001 by the European Patent Office on Oct. 27, 2023.

* cited by examiner

METHOD FOR DETERMINING TEST SIGNALS FOR ELECTROMAGNETIC SUSCEPTIBILITY TESTING OF A DEVICE-UNDER-TEST

TECHNICAL FIELD OF THE INVENTION

In general, the invention relates to electromagnetic susceptibility (EMS) testing of devices-under-test (DUT), such as communication or radar devices. More particular, the invention relates to a method and a system for determining test signals for such EMS tests as well as to a method for performing an EMS test using the determined test signals.

BACKGROUND OF THE INVENTION

When performing an EMS test with a DUT, such as a communication or a radar device, the DUT is ideally tested for its susceptibility to a multitude of different signals and signal types in dense electromagnetic environments. However, such an EMS test can be very time consuming due to the large number of possible test signals.

As a results, DUTs are often tested with only a few different types of signals, e.g. CW signals, basic modulations or recorded signals of a small number of environments. Because of this, however, signals to which the DUT is susceptible could be overlooked.

Thus, it is an objective to provide an improved method and an improved system for determining test signals for EMS testing of a DUT, which avoid the above mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the invention relates to method for determining test signals for electromagnetic susceptibility, EMS, testing of a device-under-test, DUT. The method comprises the steps of:
receiving at least one DUT parameter which defines a property of the DUT;
receiving at least one environmental parameter which defines an electromagnetic environment, EME, in which the DUT is to be used;
receiving information on an EM emission behavior, in particular an emission spectrum, of the DUT; and
inputting the at least one DUT parameter, the at least one environmental parameter and the information on the EM emission behavior to a machine learning, ML, or artificial intelligence, AI, model;
wherein the ML or AI model is configured to determine one or more test signals for EMS testing of the DUT based on the at least one DUT parameter, the at least one environmental parameter and the information on the EM emission behavior.

This achieves the advantage that the most relevant test signals for EMS testing a specific DUT can be determined. Thereby, parameters of the DUT itself and of the environment of its later use can be considered. This can greatly speed up the susceptibility testing of the DUT, which can initially be carried out with the determined test signals that are expected to be the most relevant signals.

The susceptibility of the DUT is its tendency to malfunction in the presence of certain electromagnetic emissions, e.g. RF interferences. For instance, the goal of EMS testing is to identify the signals or signal types to which the DUT is most susceptible and/or to analyze a response of the DUT to these signals.

The electromagnetic environment (EME) can refer to a spatial and/or temporal distribution of EM fields around the DUT. The at least one environmental parameter can comprise parameters defining physical properties of the EME and/or parameters which indicate certain environments, such as "medical", "car", or "aerospace & defense", for which a typical or an estimated EME is known. The environmental parameters can be chosen, e.g. buy a user, based on an expected or planned use of the DUT. For instance, if the DUT is planned to be used in a vehicle (e.g., the DUT is an automotive radar), a corresponding environmental parameter which defines a typical EME of this environment or refers to a known EME of this environment can be chosen.

The DUT can be an RF device which is capable of receiving and/or transmitting RF signals. The DUT is, for example, a communication device or a radar device, e.g. for use in a vehicle, a plane or a UAV. The DUT can be an equipment-under-test (EUT). The electromagnetic (EM) emission behavior of the DUT can be a radio frequency (RF) emission behavior of the DUT, such as an RF emission spectrum of the DUT.

The information on the EM emission behavior can comprise an emission spectrum of the DUT or a part thereof. Alternatively or additionally, the information can comprise one or more characteristics of the emission spectrum of the DUT, for example: a signal-to-nose level, max. and/or min. signal levels, and/or in-band and/or out-of-band emissions of the DUT. The information can further comprise an orientation of the DUT while recording the emission spectrum.

The ML or AI model can be executed by a processing unit, e.g. based on an ML or AI algorithm. The ML or AI model can be a trained model.

In an embodiment, the determined one or more test signals are RF signals to which the DUT in the EME is expected to be most susceptible. This achieves the advantage the most relevant (i.e., highest expected electromagnetic susceptibility) test signals and/or test signal types can be determined prior to an EMS test.

In an embodiment, the at least one DUT parameter defines a type of the DUT and/or an operating frequency of the DUT.

In an embodiment, the information on the EM emission behavior of the DUT comprises information on in-band and/or out-of-band emissions.

In an embodiment, the information on the EM emission behavior is obtained by recording and/or analyzing an emission spectrum of the DUT with a spectrum analyzer, in particular with an electromagnetic interference, EMI, test receiver.

The recorded emission spectrum can be an EMI spectrum of the DUT. The information on the EM emission behavior can comprise at least a part of the emission spectrum. The spectrum analyzer can be further configured to analyze the recorded emission spectrum in order to determine the information on the EM emission behavior.

The thus retrieved information on the EM emission behavior, in particular the recorded spectrum, can be directly or indirectly forwarded to the ML or AI model. For instance, the information (or recorded spectrum) is forwarded from the spectrum analyzer to a processing unit which executes the AI or AI model.

In an embodiment, to determine the one or more test signals, the ML or AI model is configured to query a database with the at the least one DUT parameter, the at least one environmental parameter and the information on the EM emission behavior.

According to a second aspect, the invention relates to a method for performing an EMS test with a DUT, wherein the method comprising the steps of:

generating one or more test signals, wherein the one or more test signals are determined according to the method of the first aspect of the invention; and forwarding the one or more test signals to the DUT; and analyzing a response of the DUT to the one or more test signals.

This achieves the advantage that an EMS test with the DUT can be performed using test signals to which the DUT in the EME can be expected to be most susceptible. Knowing these test signals in advance can greatly speed up the susceptibility testing.

In an embodiment, the ML or AI model is a trainable model which is trained based on the response of the DUT to the one or more test signals.

For instance, during training of the ML or AI model, the ML or AI model is configured to adapt and/or expand the database based on the response of the DUT to the one or more test signals.

According to a third aspect, the invention relates a use of the one or more test signals determined according to the method of the first aspect of the invention as jamming signals in a jammer. For instance, the jammer can generate the test signal(s) as jamming signals for jamming the DUT or a similar device (e.g., a drone or UAV).

According to a fourth aspect, the invention relates a system for determining test signals for electromagnetic susceptibility, EMS, testing of a device-under-test, DUT. The system comprises: an interface unit which is configure to receive at least one DUT parameter which defines a property of the DUT, receive at least one environmental parameter which defines an electromagnetic environment, EME, in which the DUT is to be used, and receive information on an EM emission behavior, in particular an emission spectrum, of the DUT. The system further comprises a processing unit which is configured to receive the at least one DUT parameter, the at least one environmental parameter and the information on the EM emission behavior; wherein the processing unit is configured to execute a machine learning, ML, or artificial intelligence, AI, model which is configured to determine one or more test signals for EMS testing of the DUT based on the at least one DUT parameter, the at least one environmental parameter and the information on the EM emission behavior.

For example, the processing unit can execute the ML or AI model based on an ML or AI algorithm.

In an embodiment, the system comprises a spectrum analyzer, in particular an electromagnetic interference, EMI, test receiver, which is configured to obtain the information on the EM emission behavior by recording and/or analyzing an emission spectrum of the DUT.

In an embodiment, the system further comprises a signal generator configured to generate the one or more test signals.

In an embodiment, the signal generator is configured to forward the one or more test signals to the DUT; and the system further comprises an analyzing unit configured to analyze a response of the DUT to the one or more test signals. In this way, the system can be used for EMI testing of the DUT using the test signals determined by the ML or AI model.

The above description with regard to the methods according to the first and the second aspect of the invention is correspondingly valid for the system according to the fourth aspect of the invention.

BRIEF DESCRIPTION OF THE DRAWINGS

The invention will be explained in the following together with the figures.

DETAILED DESCRIPTION OF THE PREFERRED EMBODIMENTS

Figure 1:
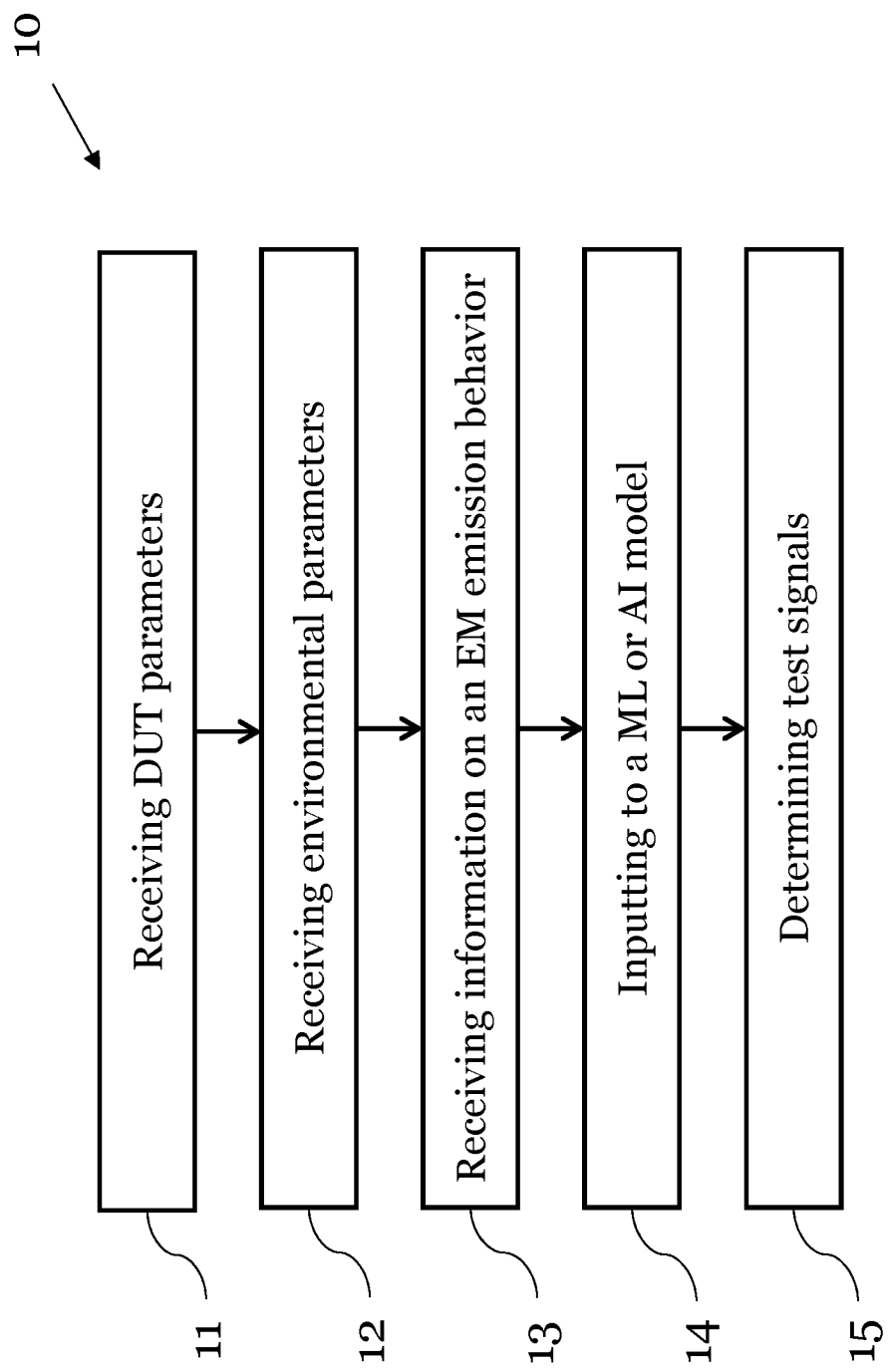
FIG. 1 shows a flow diagram of a method for determining test signals for EMS testing of a DUT according to an embodiment.

FIG. 1 shows a flow diagram of a method 10 for determining test signals for EMS testing of a DUT according to an embodiment.

The method 10 comprises the steps of: receiving 11 at least one DUT parameter which defines a property of the DUT; receiving 12 at least one environmental parameter which defines an electromagnetic environment, EME, in which the DUT is to be used; receiving information 13 on an EM emission behavior, in particular an emission spectrum, of the DUT; and inputting 14 the at least one DUT parameter, the at least one environmental parameter and the information on the EM emission behavior to a machine learning, ML, or artificial intelligence, AI, model; wherein the ML or AI model is configured to determine 15 one or more test signals for EMS testing of the DUT based on the at least one DUT parameter, the at least one environmental parameter and the information on the EM emission behavior.

For example, the determined one or more test signals are RF signals to which the DUT is expected to be most susceptible, in particular when the DUT is operated in an EME as defined by the environmental parameter. The determined one or more test signals can comprise signals of one or more signal types, e.g. CW signals.

The at least one DUT parameter can be a parameter which defines a type of the DUT and/or an operating frequency of the DUT. For example, the type of the DUT can be a communication device or a radar device.

The at least one environmental parameter can comprise parameters defining physical properties of the EME and/or parameters which indicate certain environments, such as "medical", "car", or "aerospace & defense", for which a typical or an estimated EME is known.

The DUT parameter and/or environmental parameters can be received from a user or operator via a user interface.

The information on the (electromagnetic) EM emission behavior of the DUT can be obtained based on a characterization of an emission spectrum, in particular of an EMI emission, of the DUT. For example, a spectrum analyzer, such as an EMI test receiver, can record and/or analyze an emission spectrum of the DUT. The information on the EM emission behavior can be directly or indirectly received from said spectrum analyzer.

The recorded and/or analyzed emission spectrum of the DUT can comprise in-band and/or out-of-band emissions of the DUT. Thus, the information on the emissions behavior may comprise information on the in-band and/or an out-of-band emission properties of the DUT. Furthermore, the information can comprise certain parameters of the emission, such as a signal-to-nose level, max. and/or min. signal levels, a total bandwidth. The information can further comprise an orientation of the DUT during recording of the emission behavior.

Alternatively or additionally, the information on the EM emission behavior that is received in step 13 can comprise the recorded emission spectrum or a part thereof.

The receiving steps 11, 12, 13 can be carried out in any order.

The ML or AI model can be executed based on an ML or AI algorithm, e.g. by a processing unit.

For example, to determine 15 the one or more test signals, the ML or AI model can be configured to query a database based on the at the least one DUT parameter, the at least one environmental parameter and the information on the EM emission behavior.

The ML or AI model can be configured to implement the database. For example, the database stores information on expected susceptibilities to EMS test signals for various combinations of DUT parameters, environmental parameters and/or DUT emission behaviors.

The ML or AI model can output the determined one or more test signals, for example in the form of a list of prioritized EMS test signals to which the DUT is expected to be most susceptible.

The outputted signals, e.g. the list, can be forwarded to a signal generator for generating the one or more test signals. For example, the signal generator can be configured to transmit the one or more generated test signals to the DUT, e.g. during an EMS test of the DUT.

Figure 2:
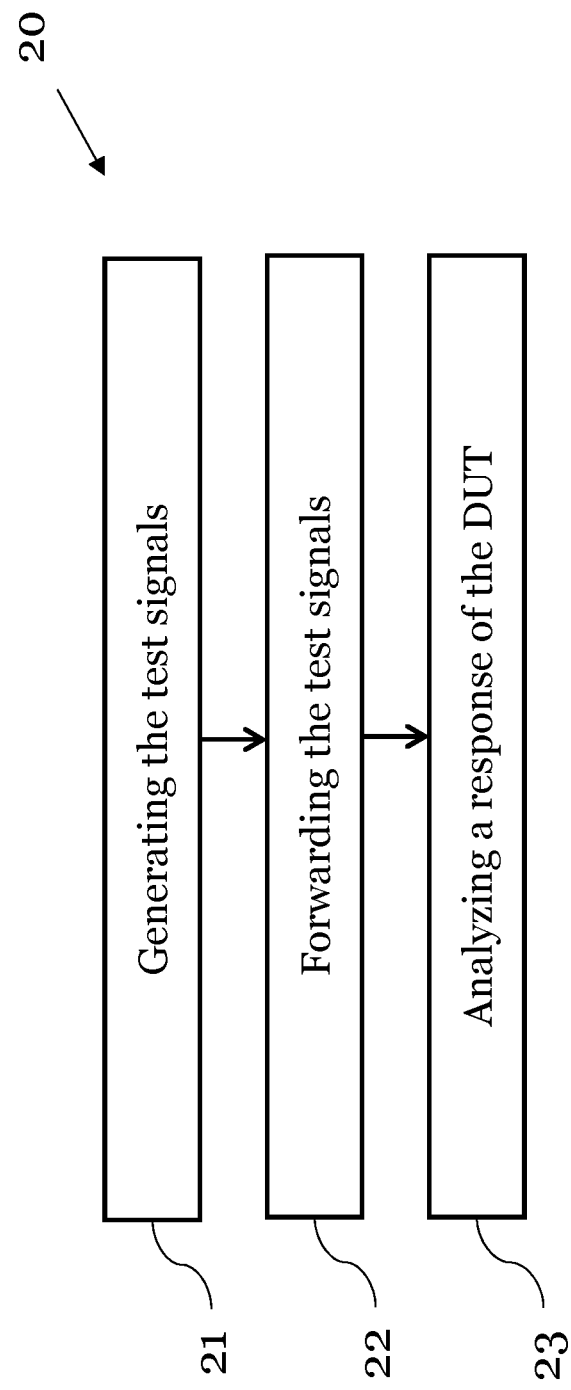
FIG. 2 shows a flow diagram of a method for performing an EMS test with a DUT according to an embodiment.

FIG. 2 shows a flow diagram of a method 20 for performing an EMS test with the DUT according to an embodiment.

The method 20 comprises the steps of generating 21 the one or more test signals, wherein the one or more test signals are determined according to the method 10 as e.g. shown in FIG. 1; forwarding 22 the one or more test signals to the DUT; and analyzing 23 a response of the DUT to the one or more test signals, in particular to each of the one or more test signals.

Thus, the DUT can be tested directly with test signals to which the DUT in the EME can be expected to be most susceptible. In this way, early pass/fail results of the EMS test can be determined.

For instance, the methods 10 and 20 can be carried out consecutively, wherein step 15 of method 10 is followed by step 21 of method 20.

Furthermore, the ML or AI model can be a trainable model. The trainable model can be trained based on the response of the DUT to the one or more test signals. In this way, the ML or AI model can successively learn to provide reduced and/or better list of test signals for new DUTs and/or EMEs.

During this training, the ML or AI model can additionally take into account: the DUT parameter(s), the environmental parameter(s) and the information on the EM emission behavior of the DUT which were used to determine 15 the one or more test signals.

In an example, where the ML or AI model is configured to determine 15 the test signal based on a database, the ML or AI model can be configured to adapt and/or expand the database during the training based on the response of the DUT to the one or more test signals.

Figure 3:
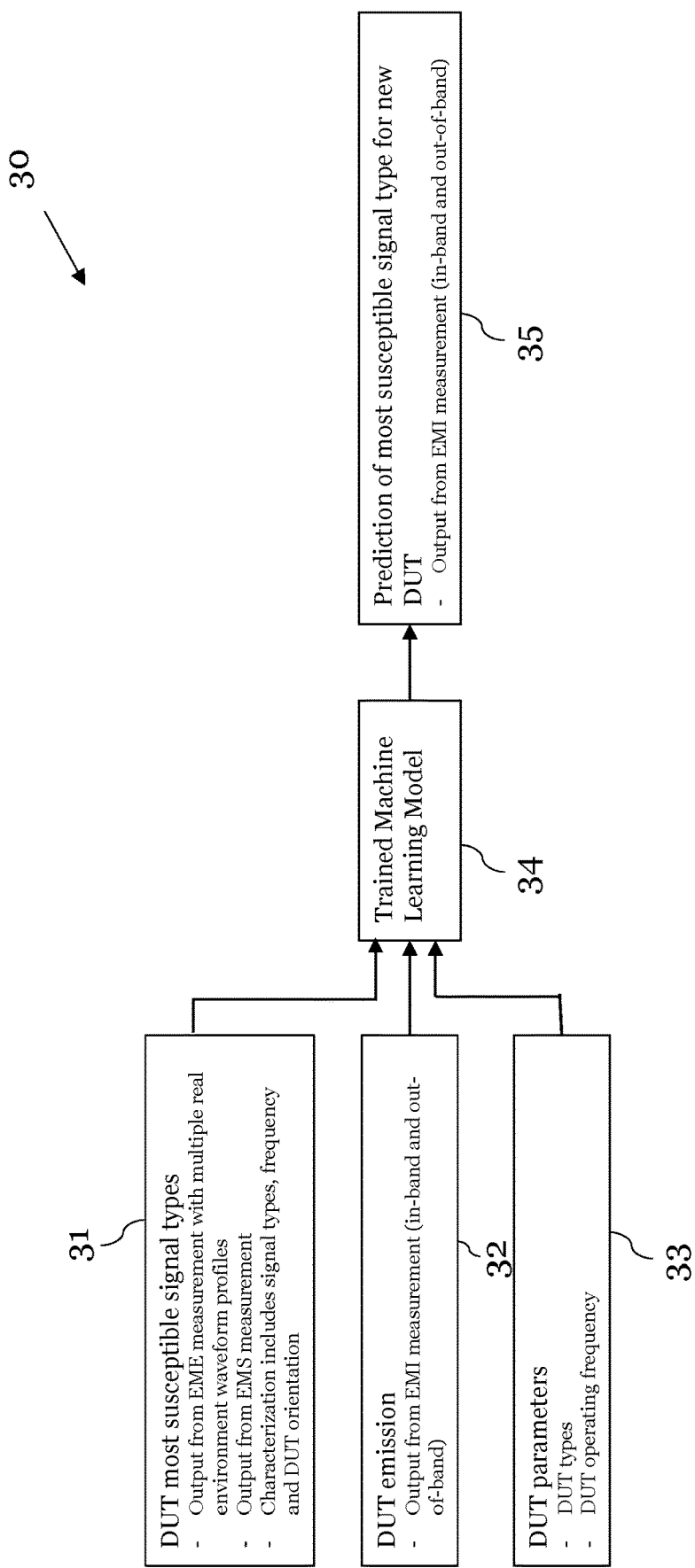
FIG. 3 shows a flow diagram of a method for training an AI or ML model according to an embodiment.

FIG. 3 shows a flow diagram of a method 30 for training the AI or ML model 34 according to an embodiment. In the example shown in FIG. 3, the AI or ML model 34 is trained based on training data 31, 32, 33. The training data 31, 32, 33 can comprise a collection of information from a plurality of DUTs, such as intentional radiators and/or communication equipment.

For example, the training data comprises, for each of the plurality of DUTs, a number of known most susceptible signals and/or signal types 31. For example, the known signals or signal types 31 are acquired by:

conducting EME and/or EMS testing with the plurality of DUTs using many different real or artificial waveforms;
characterizing, for which signal (e.g. signal type, frequency, DUT orientation) each of the plurality of DUTs is most susceptible; and
conducting an EMI test with the plurality of DUTs, wherein the EMI test characterizes both in-band as well as out-of-band emissions of each DUT.

The training data may further comprise information on EM emission behavior 32 of each of the plurality of DUTs, e.g. determined from EMI measurements (in-band and/or out-of-band), and DUT parameters 33 of the plurality of DUTs 33 (e.g., DUT types or DUT operating frequencies).

The training data can be fed to the ML or AI model 34 to build and/or update a database, e.g. by using machine learning and/or artificial intelligence methods that link EMI spectrum features and other DUT parameters to the most susceptible signals of the DUTs.

For a new DUT, the thus build database can be utilized for efficient EME or EMS testing 35. For instance, the following steps can be carried out:

performing an EMI measurement to characterize the spectral behavior of the new DUT, in particular with regards to the in-band and out-of-band emissions;
receiving user inputs on DUT parameters of the new DUT and/or the EME in which the new DUT is to be used;
querying the database for the test signal(s) to which the new DUT is expected to be most susceptible; and
carrying out an EME and/or EMS test of the new DUT using these test signal(s).

In an example, the ML or AI model is implemented by or formed by a trainable neural network (e.g., a fully connected neural network, FCNN). For example, during training, weights of the trainable neural network can be adjusted based on the training data and/or based on a response of the DUT to the one or more test signals, in particular to each of the one or more test signals.

The trained ML or AI model can be executed by a processing unit of a computer to determine the one or more test signals.

In addition to EMS testing, the determined test signals can be used for other application. For example, the test signals can be used as jamming signals in a jammer.

For example, the ML or AI model can determine one or more jamming signals, which will have the strongest effect on the DUT in the expected EME. If the DUT is e.g. a UAV or a drone, the ML or AI model can be interfaced to a jammer to forward the jamming signal(s). The jammer can generate the jamming signals which strongly affect the UAV and/or drone and e.g. force the UAV and/or drone to land or break the communication link of the UAV and/or drone.

Figure 4:
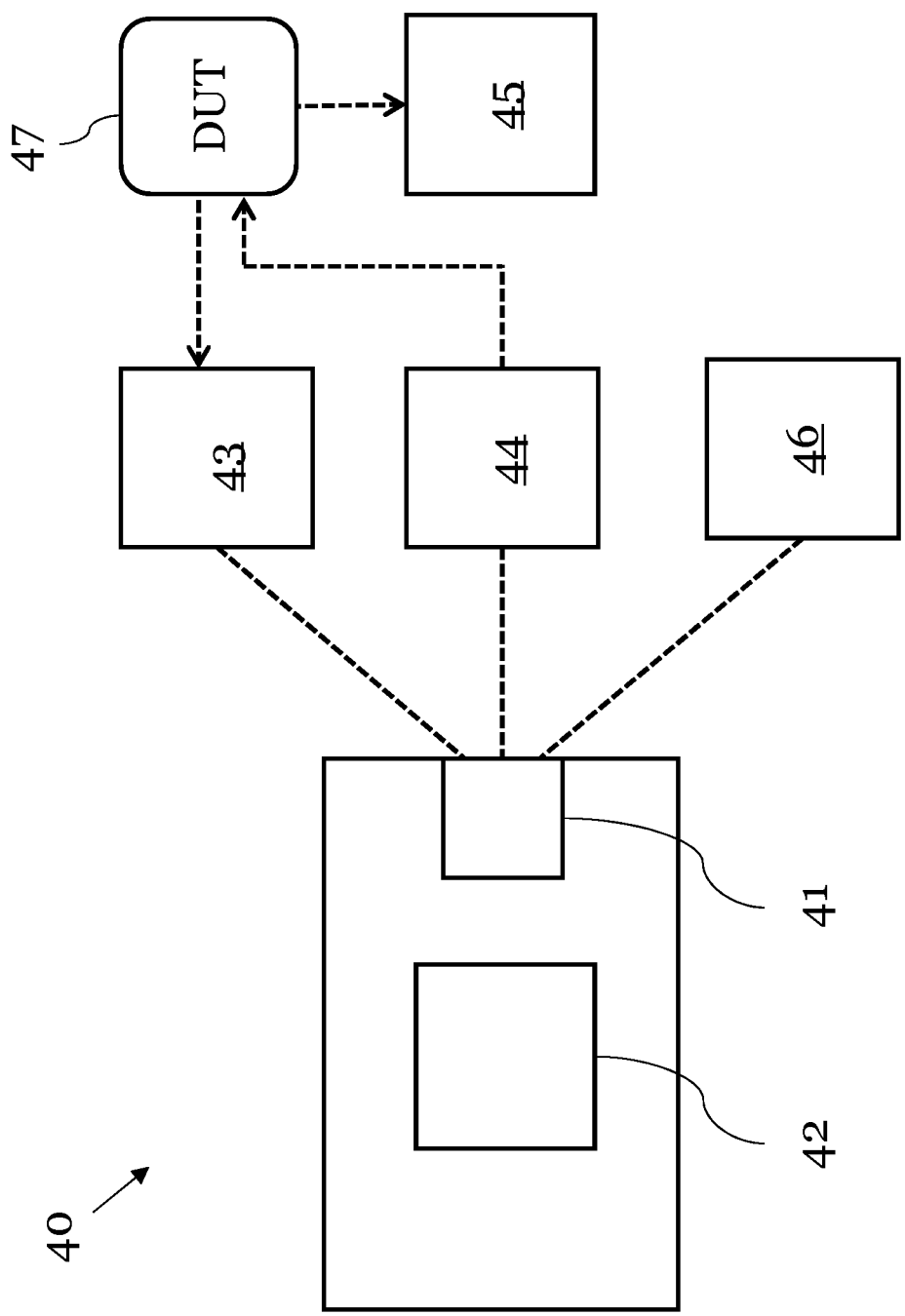
FIG. 4 shows a schematic diagram of a system for determining test signals for EMS testing of a DUT according to an embodiment.

FIG. 4 shows a schematic diagram of a system 40 for determining test signals for EMS testing of the DUT 47 according to an embodiment.

The system 40 comprises an interface unit 41 which is configure to: receive the at least one DUT parameter which defines a property of the DUT 47, receive the at least one environmental parameter which defines an electromagnetic environment, EME, in which the DUT 47 is to be used, and receive the information on an EM emission behavior, in particular an emission spectrum, of the DUT 47. The system 40 further comprises a processing unit 42 which is configured to receive the at least one DUT parameter, the at least one environmental parameter and the information on the EM emission behavior; wherein the processing unit 42 is configured to execute the machine learning, ML, or artificial intelligence, AI, model which is configured to determine the one or more test signals for EMS testing of the DUT 47 based on the at least one DUT parameter, the at least one environmental parameter and the information on the EM emission behavior.

The interface unit 41 can comprise a plurality of sub unit. For instance the interface unit 41 comprises one or more user interfaces (UI) configured to receive the DUT parameters and/or environmental parameters. The interface unit 41 may further comprise a dedicated interface, e.g. a communication interface, for receiving the information on the EM emission behavior of the DUT.

The processing unit 42 can be a microprocessor.

The system 40 can further comprise a spectrum analyzer 43, in particular an EMI test receiver, which is configured to obtain the information on the EM emission behavior by recording and/or analyzing the (RF) emission spectrum of the DUT 47.

The system 40 can further comprise a signal generator 44 configured to generate the one or more test signals. For instance, the signal generator 44 can be connected to the interface unit 41 and receive, via the interface unit 41, information on the determined test signals, e.g. in the form of a list defining signal parameters of the test signals.

The signal generator 44 can be configured to forward the one or more test signals to the DUT 47.

The system 40 can further comprise an analyzing unit 45 configured to analyze a response of the DUT 47 to the one or more test signals, in particular to each of the one or more test signals. In this way, the system 40 can perform an EMS test of the DUT 47.

The system can be communicatively connected to further devices via the interface unit 41. For instance, the system 46 can be connected to a jammer 46 and can be configured to forward the test signal to the jammer 46. The jammer 46 can use the test signal as jamming signal when jamming the DUT 47 in the EME (or a DUT of similar type and/or in a similar EME).

The invention claimed is:

1. A method for generating radio frequency, RF, test signals for electromagnetic susceptibility, EMS, testing of a device-under-test, DUT, the method comprising the steps of:
   receiving at least one DUT parameter which defines a property of the DUT;
   receiving at least one environmental parameter which defines an electromagnetic environment, EME, in which the DUT is to be used;
   receiving information on an EM emission behavior;
   inputting the at least one DUT parameter, the at least one environmental parameter and the information on the EM emission behavior to a machine learning, ML, or artificial intelligence, AI, model;
   wherein the ML or AI model is configured to determine one or more RF test signals for EMS testing of the DUT based on the at least one DUT parameter, the at least one environmental parameter and the information on the EM emission behavior;
   generating the one or more RE test signals;
   transmitting the one or more RF test signals to the DUT; and
   analyzing a response of the DUT to the one or more RF test signals to which the DUT in the EME is expected to be most susceptible.

2. The method of claim 1, wherein the at least one DUT parameter defines a type of the DUT and/or an operating frequency of the DUT.

3. The method of claim 1, wherein the information on the EM emission behavior of the DUT comprises information on in-band and/or out-of-band emissions.

4. The method of claim 1, wherein the information on the EM emission behavior is obtained by recording and/or analyzing an emission spectrum of the DUT with a spectrum analyzer.

5. The method of claim 1, wherein, to generate the one or more RF test signals, the ML or AI model is configured to query a database with the at the least one DUT parameter, the at least one environmental parameter and the information on the EM emission behavior.

6. The method of claim 1, further comprising:
   wherein the ML or AI model is a trainable model which is trained based on the response of the DUT to the one or more RF test signals.

7. A method for generating jamming signals, comprising the steps of:
   receiving at least one DUT parameter which defines a property of the DUT;
   receiving at least one environmental parameter which defines an electromagnetic environment, EME, in which the DUT is to be used;
   receiving information on an EM emission behavior; and
   inputting the at least one DUT parameter, the at least one environmental parameter and the information on the EM emission behavior to a machine learning, ML, or artificial intelligence, AI, model;
   wherein the ML or AI model is configured to determine one or more test signals for EMS testing of the DUT based on the at least one DUT parameter, the at least one environmental parameter and the information on the EM emission behavior;
   generating the one or more test signals;
   forwarding the one or more test signals to a jammer; and
   using the one or more test signals as jamming signals by the jammer.

8. A system for generating radio frequency, RF, test signals for electromagnetic susceptibility, EMS, testing of a device-under-test, DUT, comprising:
   an interface unit which is configure to:
      receive at least one DUT parameter which defines a property of the DUT,
      receive at least one environmental parameter which defines an electromagnetic environment, EME, in which the DUT is to be used, and
      receive information on an EM emission behavior of the DUT;
   a processing unit which is configured to receive the at least one DUT parameter, the at least one environmental parameter and the information on the EM emission behavior;
   wherein the processing unit is configured to execute a machine learning, ML, or artificial intelligence, AI, model which is configured to determine one or more RF test signals for EMS testing of the DUT based on the at least one DUT parameter, the at least one environmental parameter and the information on the EM emission behavior;

wherein the system further comprises a signal generator configured to generate the one or more RE test signals;

wherein the signal generator is configured to transmit the one or more RF test signals to the DUT; and wherein the system further comprises an analyzing unit configured to analyze a response of the DUT to the one or more RF test signals to which the DUT in the EME is expected to be most susceptible.

9. The system of claim 8, further comprising:

a spectrum analyzer which is configured to obtain the information on the EM emission behavior by recording and/or analyzing an emission spectrum of the DUT.

* * * * *